(12) United States Patent
Syed et al.

(10) Patent No.: US 9,420,378 B1
(45) Date of Patent: Aug. 16, 2016

(54) TOP PORT MEMS MICROPHONE PACKAGE AND METHOD

(75) Inventors: Ahmer Raza Syed, Chandler, AZ (US); Bob Shih-Wei Kuo, Chandler, AZ (US); Louis B. Troche, Jr., Gilbert, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 664 days.

(21) Appl. No.: 12/834,682

(22) Filed: Jul. 12, 2010

(51) Int. Cl.
*H04R 9/08* (2006.01)
*H04R 11/04* (2006.01)

(52) U.S. Cl.
CPC . *H04R 9/08* (2013.01); *H04R 11/04* (2013.01)

(58) Field of Classification Search
CPC ........... H01L 2224/48227; H01L 2224/32225; H01L 2224/48247; H01L 2224/48228; H01L 2224/97; H01L 23/10; H01L 24/73; H01L 27/00; H01L 21/52; H01L 23/3121; H01L 27/14632; H04R 19/005; H04R 19/04; H04R 31/006; H04R 2201/003; H04R 2410/00
See application file for complete search history.

(56) References Cited

U.S. PATENT DOCUMENTS

| | | | |
|---|---|---|---|
| 4,525,817 A | | 6/1985 | Takuya |
| 6,522,762 B1 * | | 2/2003 | Mullenborn et al. ......... 381/174 |
| 6,781,231 B2 | | 8/2004 | Minervini |
| 6,862,002 B2 | | 3/2005 | Demicco et al. |
| 7,129,576 B2 * | 10/2006 | Humpston .................... 257/704 |
| 7,132,307 B2 | 11/2006 | Wang et al. |
| 7,166,910 B2 * | 1/2007 | Minervini .................... 257/704 |
| 7,221,767 B2 * | 5/2007 | Mullenborn et al. ......... 381/174 |
| 7,242,089 B2 * | 7/2007 | Minervini .................... 257/704 |
| 7,381,589 B2 * | 6/2008 | Minervini .................... 438/113 |
| 7,382,048 B2 | 6/2008 | Minervini |
| 7,434,305 B2 * | 10/2008 | Minervini ...................... 29/594 |
| 7,439,616 B2 * | 10/2008 | Minervini .................... 257/704 |
| 7,501,703 B2 | 3/2009 | Minervini |
| 7,537,964 B2 * | 5/2009 | Minervini .................... 438/113 |
| 7,763,972 B2 * | 7/2010 | Chien et al. .................. 257/704 |

(Continued)

FOREIGN PATENT DOCUMENTS

| | | |
|---|---|---|
| JP | 2000-307164 | 11/2000 |
| JP | 2002-057482 | 2/2002 |
| JP | 2010-187277 | 8/2010 |

OTHER PUBLICATIONS

Miks et al., "Top Port with Interposer MEMS Microphone Package and Method", U.S. Appl. No. 13/016,343, filed Jan. 28, 2011.

(Continued)

*Primary Examiner* — Marlon Fletcher
(74) *Attorney, Agent, or Firm* — McAndrews, Held & Malloy, Ltd.

(57) ABSTRACT

A top port MEMS microphone package includes a substrate having a back volume expanding aperture therein. A MEMS microphone electronic component is mounted to the substrate directly above the back volume expanding aperture such that an aperture of the MEMS microphone electronic component is in fluid communication with the back volume expanding aperture. A lid having a lid cavity is mounted to the substrate. The back volume expanding aperture couples the aperture of the MEMS microphone electronic component to the lid cavity. By coupling the lid cavity to the aperture with the back volume expanding aperture, the resulting back volume is essentially the size of the entire top port MEMS microphone package. In this manner, the noise to signal ratio is minimized thus maximizing the sensitivity of the top port MEMS microphone package as well as the range of applications.

20 Claims, 9 Drawing Sheets

(56) References Cited

U.S. PATENT DOCUMENTS

| | | | |
|---|---|---|---|
| 8,018,049 B2 * | 9/2011 | Minervini | 257/704 |
| 8,121,331 B2 * | 2/2012 | Minervini | 381/360 |
| 8,704,360 B1 * | 4/2014 | Minervini | 257/704 |
| 2002/0102004 A1 * | 8/2002 | Minervini | 381/175 |
| 2003/0035558 A1 | 2/2003 | Kawamura et al. | |
| 2004/0184632 A1 | 9/2004 | Minervini | |
| 2005/0018864 A1 * | 1/2005 | Minervini | 381/175 |
| 2005/0185812 A1 * | 8/2005 | Minervini | 381/355 |
| 2005/0189635 A1 * | 9/2005 | Humpston et al. | 257/678 |
| 2006/0157841 A1 * | 7/2006 | Minervini | 257/680 |
| 2007/0064968 A1 * | 3/2007 | Weigold | 381/369 |
| 2007/0082421 A1 * | 4/2007 | Minervini | 438/50 |
| 2007/0201715 A1 * | 8/2007 | Minervini | 381/355 |
| 2007/0202627 A1 * | 8/2007 | Minervini | 438/51 |
| 2007/0205492 A1 * | 9/2007 | Wang | 257/659 |
| 2007/0215962 A1 | 9/2007 | Minervini et al. | |
| 2008/0150111 A1 | 6/2008 | Hiller et al. | |
| 2008/0175425 A1 * | 7/2008 | Roberts et al. | 381/361 |
| 2009/0057876 A1 | 3/2009 | Chien et al. | |
| 2009/0140413 A1 * | 6/2009 | Wang et al. | 257/698 |
| 2010/0119097 A1 | 5/2010 | Ohtsuka | |
| 2010/0183174 A1 * | 7/2010 | Suvanto et al. | 381/174 |
| 2011/0042762 A1 * | 2/2011 | Laming et al. | 257/416 |
| 2011/0198714 A1 * | 8/2011 | Yang | B81B 7/0061 257/416 |
| 2011/0210409 A1 * | 9/2011 | Minervini | 257/416 |
| 2012/0043629 A1 * | 2/2012 | Minervini | 257/416 |
| 2012/0319256 A1 * | 12/2012 | Lo | B81B 7/0061 257/666 |
| 2013/0032905 A1 * | 2/2013 | Lo et al. | 257/416 |
| 2013/0104384 A1 * | 5/2013 | Weigold | 29/594 |
| 2014/0169607 A1 * | 6/2014 | Goida | H04R 1/021 381/365 |
| 2014/0226846 A1 * | 8/2014 | Sheplak et al. | 381/361 |
| 2014/0264650 A1 * | 9/2014 | Liu | B81B 3/0078 257/416 |
| 2015/0023523 A1 * | 1/2015 | Elian et al. | 381/91 |

OTHER PUBLICATIONS

Kuo et al., "Stacked and Staggered Die MEMS Package and Method", U.S. Appl. No. 13/046,071, filed Mar. 11, 2011.

Kuo et al., "Metal Mesh Lid MEMS Package and Method", U.S. Appl. No. 13/096,359, filed Apr. 28, 2011.

Gabriel, K., "Akustica", Sep. 29, 2005, 46 pages, Akustica, Inc., Pittsburgh, PA, USA.

"Infineon®-SMM310™ Silicon MEMS Microphone", Product Brief, 2007, 2 pages, Infineon Technologies AG, Munich, Germany. No author provided.

"Surface Mount MEMS Microphones", 2 pages. Retrieved on Apr. 28, 2010 from the Internet: <URL:http://www.knowles.com/search/product.htm?x_sub_cat_id=3>. No author provided.

* cited by examiner

TOP PORT MEMS MICROPHONE PACKAGE AND METHOD

TECHNICAL FIELD

The present application relates to the field of electronics, and more particularly, to methods of forming electronic component packages and related structures.

BACKGROUND

A Micro Electro Mechanical Systems (MEMS) microphone electronic component includes a moveable compliant diaphragm and a rigid perforated backplate on a silicon substrate. The diaphragm and backplate form a capacitor. As sound waves move the diaphragm, the capacitance between the diaphragm and backplate changes. The capacitance variations are converted into an electrical signal. In this manner, sound waves are converted into an electrical signal.

To optimize the sensitivity of the MEMS microphone electronic component, it is ideal to have a balanced front volume, defined by the space wherein the sound source and the front of the diaphragm belong, and back volume, defined by the space below the diaphragm and the substrate surface where the MEMS microphone electronic component is attached to. Typically the back volume in a MEMS microphone package design is limited by the available space below the diaphragm. It is therefore desirable in the MEMS microphone package design to increase the back volume to achieve higher performance.

BRIEF DESCRIPTION OF THE DRAWINGS

In the following description, the same or similar elements are labeled with the same or similar reference numbers.

DETAILED DESCRIPTION

Figure 1:
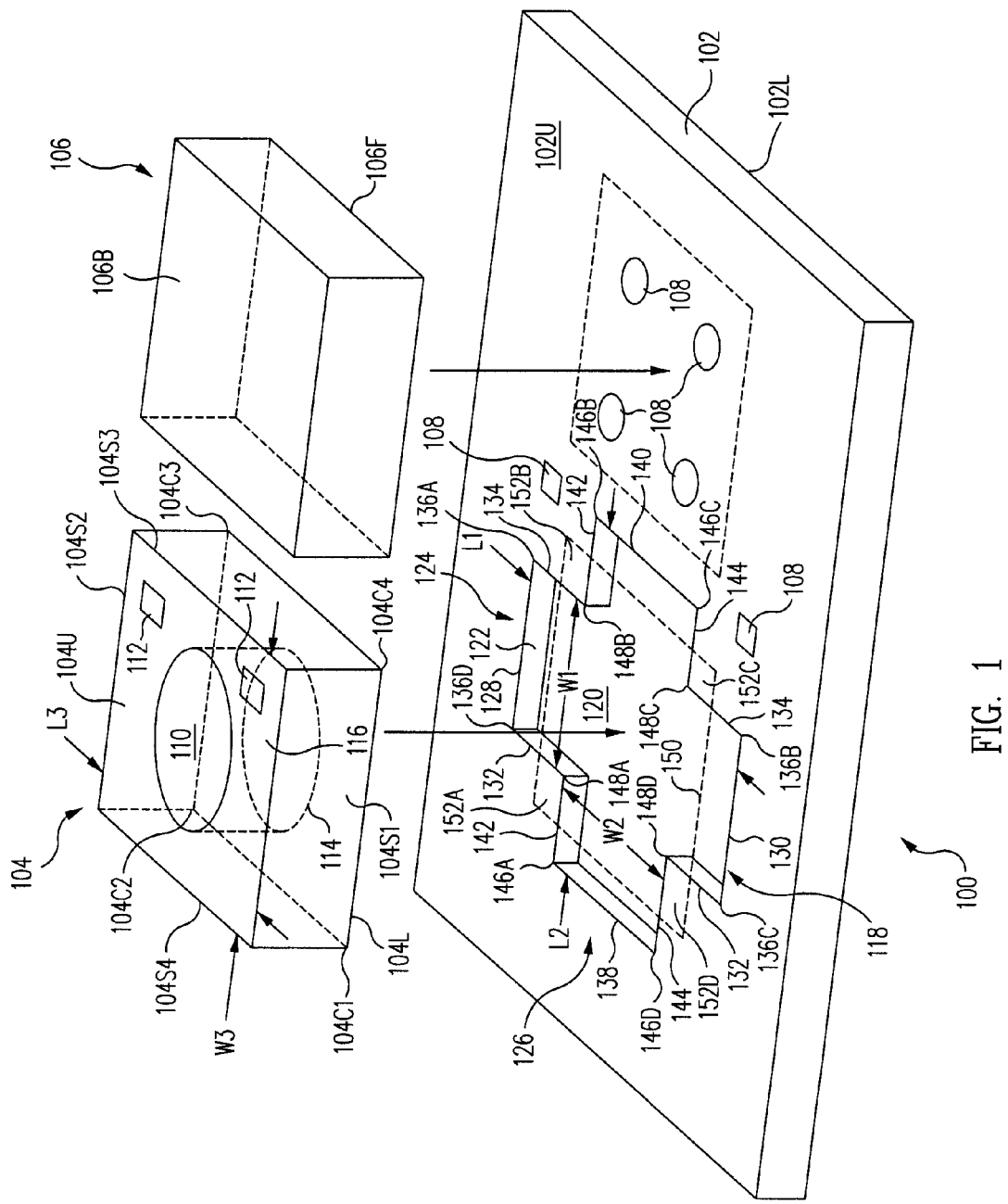
FIG. 1 is an exploded top perspective view of a top port MEMS microphone package during fabrication in accordance with one embodiment.
Figure 2:
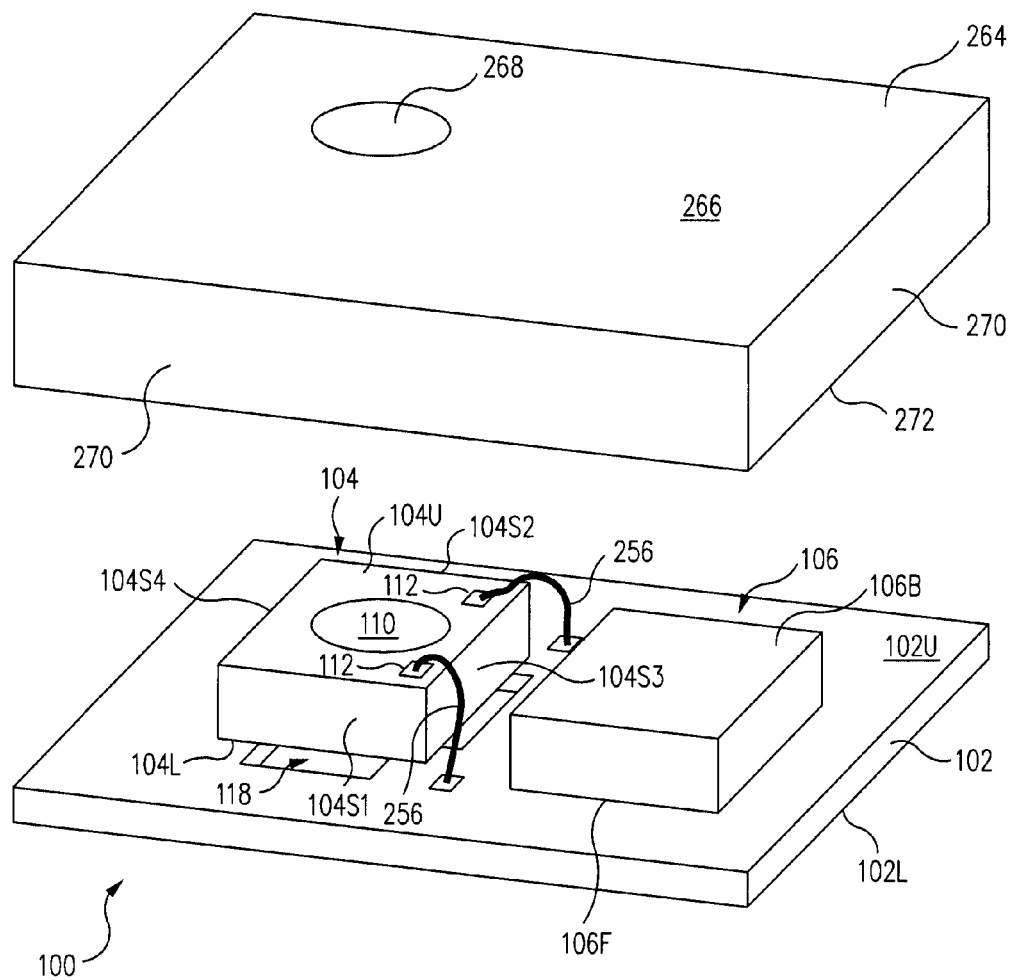
FIGS. 2, 3 are cross-sectional views of the top port MEMS microphone package of FIG. 1 at later stages during fabrication in accordance with various embodiments.
Figure 3:
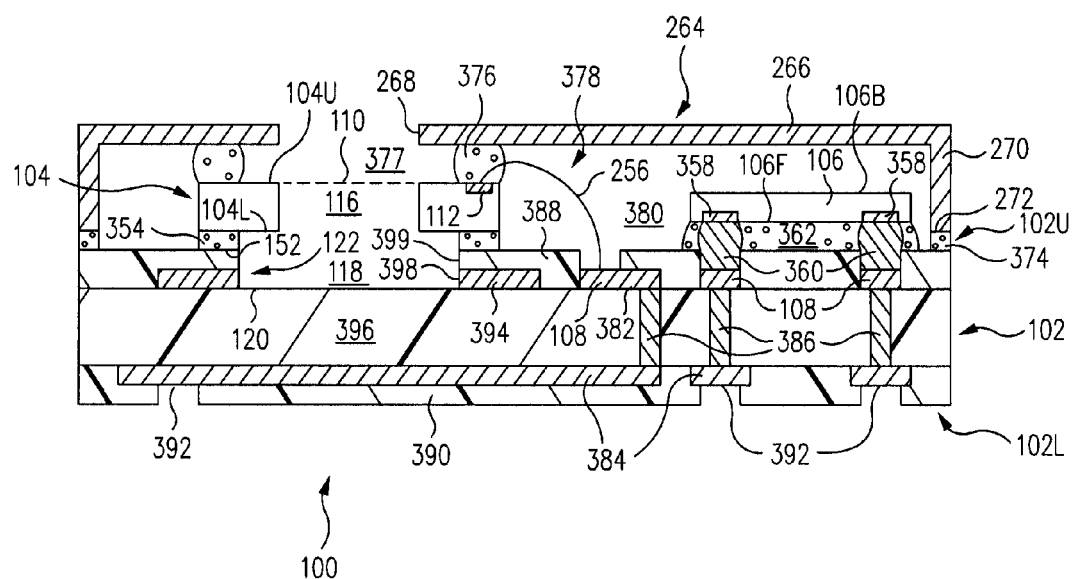

As an overview and in accordance with one embodiment, referring to FIGS. 1, 2, and 3 together, a top port MEMS microphone package 100 includes a substrate 102 having a back volume expanding aperture 118 therein. A MEMS microphone electronic component 104 is mounted to substrate 102 directly above back volume expanding aperture 118 such that an aperture 116 of MEMS microphone electronic component 104 is in fluid communication with back volume expanding aperture 118.

A lid 264 having a lid cavity 380 is mounted to substrate 102. Back volume expanding aperture 118 couples aperture 116 of MEMS microphone electronic component 104 to lid cavity 380. By coupling lid cavity 380 to aperture 116 with back volume expanding aperture 118, the resulting back volume 378 is essentially the size of the entire top port MEMS microphone package 100. In this manner, the noise to signal ratio is minimized thus maximizing the sensitivity of the top port MEMS microphone package 100 as well as the range of applications.

Now in more detail, FIG. 1 is an exploded top perspective view of a top port Micro Electro Mechanical Systems (MEMS) microphone package 100 during fabrication in accordance with one embodiment. Top port MEMS microphone package 100, sometimes called an electronic component package, includes a substrate 102, a MEMS microphone electronic component 104, and a converter electronic component 106.

Substrate 102 includes a dielectric material such as laminate, ceramic, printed circuit board material, or other dielectric material. Formed on an upper, e.g., first, surface 102U of substrate 102 are electrically conductive upper, e.g., first, terminals 108, e.g., formed of copper. Substrate 102 further includes a lower, e.g., second, surface 102L.

MEMS microphone electronic component 104 is a conventional MEMS microphone electronic component, sometimes called a MEMS chip. Accordingly, the features and functions of MEMS microphone electronic component 104 are well known to those of skill in the art. Thus, only a general description of various features and functions of MEMS microphone electronic component 104 are set forth below.

MEMS microphone electronic component 104 includes a lower, e.g., first, surface 104L and an opposite upper, e.g., second, surface 104U. MEMS microphone electronic component 104 further includes sides 104S1, 104S2, 104S3, 104S4 extending perpendicularly between upper surface 104U and lower surface 104L. Sides 104S1, 104S2, 104S3, 104S4 are collectively referred to as sides 104S.

MEMS microphone electronic component 104 further includes a moveable compliant diaphragm 110 and bond pads 112 formed at upper surface 104U. MEMS microphone electronic component 104 further includes a rigid perforated backplate 114 at lower surface 104L.

MEMS microphone electronic component 104 further includes an aperture 116 extending through MEMS microphone electronic component 104 and between upper surface 104U and lower surface 104L. More particularly, aperture 116 extends between and separates diaphragm 110 and backplate 114 such that diaphragm 110 and backplate 114 form a capacitor.

As described further below, during operation, sound waves move diaphragm 110 thus causing changes in the capacitance between diaphragm 110 and backplate 114. An electrical signal corresponding to the capacitance variations is output on bond pads 112.

Converter electronic component 106 is also a conventional converter electronic component, sometimes called an Application Specific Integrated Circuit (ASIC) chip. Accordingly, the features and functions of converter electronic component 106 are well known to those of skill in the art. Thus, only a general description of various features and functions of converter electronic component 106 are set forth below.

Converter electronic component 106 includes a frontside, e.g., first, surface 106F and an opposite backside surface 106B. Frontside surface 106F is sometimes called an active surface and backside surface 106B is sometimes called an inactive surface. As discussed further below, frontside surface 106F includes bond pads.

Substrate 102 further includes a back volume expanding aperture 118. Back volume expanding aperture 118 is defined by a back volume expanding aperture base 120 and a back volume expanding aperture sidewall 122.

Back volume expanding aperture base 120 is a surface parallel to upper surface 102U of substrate 102 and located between upper surface 102U and lower surface 102L of substrate 102. Back volume expanding aperture sidewall 122 extends perpendicularly between back volume expanding aperture base 120 and upper surface 102U of substrate 102. Although the terms parallel, perpendicular, and similar terms are used herein, it is to be understood that the described features may not be exactly parallel and perpendicular, but only substantially parallel and perpendicular to within excepted manufacturing tolerances.

In accordance with this embodiment, back volume expanding aperture 118 is shaped like a cross in the plane of upper surface 102U. More particularly, back volume expanding aperture 118 is a recessed cross and includes a first arm 124 perpendicular to and intersecting a second arm 126.

Arm 124 is shaped as a rectangular bar and has a first end 128, a second end 130, a first side 132, and a second side 134. Ends 128, 130 are parallel to one another and extend in a direction parallel to upper surface 102U of substrate 102. Ends 128, 130 are separated by a distance equal to a length L1 of arm 124.

Sides 132, 134 are also parallel to one another and extend in a direction parallel to upper surface 102U of substrate 102. Sides 132, 134 are separated by a distance equal to a width W1 of arm 124. Further, ends 128, 130 are perpendicular to sides 132, 134.

The intersection of end 128 and side 134 defines a first corner 136A of arm 124. The intersection of side 134 and end 130 defines a second corner 136B of arm 124. The intersection of end 130 and side 132 defines a third corner 136C of arm 124. The intersection of side 132 and end 128 defines a fourth corner 136D of arm 124. Accordingly, arm 124 is defined by the four corners 136A, 136B, 136C, 136D. Note that portions of sides 132, 134 are cutaway due to the intersection with arm 126.

Similarly, arm 126 is shaped as a rectangular bar and has a first end 138, a second end 140, a first side 142, and a second side 144. Ends 138, 140 are parallel to one another and extend in a direction parallel to upper surface 102U of substrate 102. Ends 138, 140 are separated by a distance equal to a length L2 of arm 126.

Sides 142, 144 are also parallel to one another and extend in a direction parallel to upper surface 102U of substrate 102. Sides 142, 144 are separated by a distance equal to a width W2 of arm 126. Further, ends 138, 140 are perpendicular to sides 142, 144.

The intersection of end 138 and side 142 defines a first corner 146A of arm 126. The intersection of side 142 and end 140 defines a second corner 146B of arm 126. The intersection of end 140 and side 144 defines a third corner 146C of arm 126. The intersection of side 144 and end 138 defines a fourth corner 146D of arm 126. Accordingly, arm 126 is defined by the four corners 146A, 146B, 146C, 146D. Note that portions of sides 142, 144 are cutaway due to the intersection with arm 124.

Side 132 and side 142 perpendicularly intersect at a corner 148A. Side 142 and side 134 perpendicularly intersect at a corner 148B. Side 134 and side 144 perpendicularly intersect at a corner 148C. Side 132 and side 144 perpendicularly intersect at a corner 148D.

In the plane of upper surface 102U, back volume expanding aperture 118 is defined by the twelve corners 136A, 148B, 146B, 146C, 148C, 136B, 136C, 148D, 146D, 146A, 148A, 136D.

A MEMS microphone electronic component mounting area 150 as indicated by the dashed rectangle of substrate 102 is defined as the area where MEMS microphone electronic component 104 is to be placed on substrate 102. In other words, MEMS microphone electronic component mounting area 150 is the area of substrate 102 defined by superimposing lower surface 104L of MEMS microphone electronic component 104 on substrate 102 in the final mounted configuration. Thus, the description of lower surface 104L of MEMS microphone electronic component 104 is generally applicable to MEMS microphone electronic component mounting area 150.

MEMS microphone electronic component 104 including lower surface 104L has length L3 between opposing sides 104S1, 104S2 and a width W3 between opposing sides 104S3, 104S4. In one embodiment, MEMS microphone electronic component 104 is square such that length L3 is equal to width W3, although in other embodiments, length L3 is greater than or less than width W3.

Length L1 of arm 124 is greater than length L3 of MEMS microphone electronic component 104. Further, length L2 of arm 126 is greater than width W3 of MEMS microphone electronic component 104. Accordingly, arms 124, 126 project laterally outward past sides 104S1, 104S2, 104S3, 104S4 of electronic component 104. More particularly, ends 130, 138, 128, 140 are located laterally outwards past sides 104S1, 104S4, 104S2, 104S3, respectively.

However, width W1 of arm 124 is less than width W3 of MEMS microphone electronic component 104. Further, width W2 of arm 126 is less than length L3 of MEMS microphone electronic component 104. Accordingly, sides 104S1, 104S2 are laterally outwards of sides 144, 142 of arm 126, respectively. Further, sides 104S3, 104S4 are laterally outwards of sides 134, 132 of arm 124, respectively.

Accordingly, the four corners 104C1, 104C2, 104C3, 104C4 of MEMS microphone electronic component 104 and also of lower surface 104L are located laterally outward of back volume expanding aperture 118. Generally, back volume expanding aperture 118 is located directly below aperture 116 of MEMS microphone electronic component 104 and extends laterally outward past at least one of sides 104S1, 104S2, 104S3, 104S4.

In accordance with this embodiment, the portions of upper surface 102U directly adjacent corners 148A, 148B, 148C, 148D and within MEMS microphone electronic component mounting area 150 define MEMS microphone electronic component mounting pads 152A, 152B, 152C, 152D, respectively. Generally, the areas of upper surface 102U outside of back volume expanding aperture 118 yet inside of MEMS microphone electronic component mounting area 150 define MEMS microphone electronic component mounting pads 152A, 152B, 152C, 152D. MEMS microphone electronic component mounting pads 152A, 152B, 152C, 152D are collectively referred to as MEMS microphone electronic component mounting pads 152 and are sometimes referred to as standoffs.

As illustrated in FIGS. 2 and 3 and discussed further below, the four corners 104C1, 104C2, 104C3, 104C4 of MEMS microphone electronic component 104 including lower surface 104L are mounted to and supported by MEMS microphone electronic component mounting pads 152D, 152A, 152B, 152C, respectively.

Generally, MEMS microphone electronic component mounting pads 152A, 152B, 152C, 152D support MEMS microphone electronic component 104 above back volume expanding aperture 118. More particularly, lower surface 104L of MEMS microphone electronic component 104 is spaced apart from back volume expanding aperture base 120 by MEMS microphone electronic component mounting pads 152A, 152B, 152C, 152D.

FIGS. 2, 3 are cross-sectional views of top port MEMS microphone package 100 of FIG. 1 at later stages during fabrication in accordance with various embodiments. Referring now to FIGS. 1, 2, and 3 together, lower surface 104L of MEMS microphone electronic component 104 is mounted to upper surface 102U of substrate 102 with an adhesive 354. More particularly, the four corners 104C1, 104C2, 104C3, 104C4 of lower surface 104L are mounted to MEMS microphone electronic component mounting pads 152D, 152A, 152B, 152C, respectively, by adhesive 354.

By using adhesive 354, robust die attach strength of attachment of MEMS microphone electronic component 104 to substrate 102 is achieved. Further, no special preparation of MEMS microphone electronic component 104 is necessary and no special capital equipment is required.

Bond pads 112 of MEMS microphone electronic component 104 are electrically connected to respective terminals 108 with electrically conductive bond wires 256.

Further, in accordance with this embodiment, converter electronic component 106 is flip chip mounted to upper surface 102U of substrate 102. More particularly, bond pads 358 on front side surface 106F of converter electronic component 106 are physically and electrically connected to respective terminals 108 by flip chip bumps 360, e.g., solder bumps. Optionally, an underfill 362 is applied between front side surface 106F and upper surface 102U and encloses flip chip bumps 360.

Top port MEMS microphone package 100 further includes a lid 264. Lid 264 is shown in an exploded view in FIG. 2. Lid 264 includes a lid plate 266 having a top port 268, i.e., an opening, sometimes called a port hole, formed therein. Lid 264 further includes lid sidewalls 270 extending downwards from lid plate 266 and terminating at a lid sidewall base 272, e.g., an annular surface parallel to upper surface 102U of substrate 102. Lid sidewall base 272 is mounted to the outer periphery of upper surface 102U of substrate 102, e.g., with a lid adhesive 374.

Top port MEMS microphone package 100 further includes an acoustic seal 376. More particularly, acoustic seal 376 is on upper surface 104U of MEMS microphone electronic component 104 around the periphery of diaphragm 110. To avoid inadvertent contact between acoustic seal 376 and diaphragm 110, a small area of upper surface 104U is exposed between acoustic seal 376 and diaphragm 110. Stated another way, acoustic seal 376 is space apart from diaphragm 110 on upper surface 104U to avoid inadvertent contact between acoustic seal 376 and diaphragm 110. Backplate 114 is not illustrated in the view of FIG. 3 for simplicity.

In accordance with this embodiment, acoustic seal 376 encloses bond pads 112 and a portion of bond wires 256. However, in light of this disclosure, those of skill in the art will understand that in other embodiments acoustic seal 376 is located on upper surface 104U between diaphragm 110 and bond pads 112 depending upon the particular location of bond pads 112 and the configuration of upper surface 104U.

Illustratively, acoustic seal 376 is formed of a dielectric material such as epoxy. For example, acoustic seal 376 is applied as a bead around diaphragm 110. Lid 264 is then mounted to substrate 102 such that lid plate 266 is pressed into acoustic seal 376. Acoustic seal 376 is cured, if necessary.

Further, acoustic seal 376 is on the lower surface of lid plate 266 of lid 264 around the periphery of top port 268. Acoustic seal 376 extends and forms a seal between upper surface 104U of MEMS microphone electronic component 104 and lid plate 266 of lid 264 around both top port 268 and diaphragm 110.

However, top port 268 and diaphragm 110 are in fluid communication with each other. As used herein, regions are in fluid communication when they are directly connected to one another without an intervening structure such that fluid, e.g., air, and sound can freely move from one region to the other.

More particularly, diaphragm 110 is exposed directly to the ambient environment through top port 268. Accordingly, sound freely travels through top port 268 to contact diaphragm 110. Acoustic seal 376 prevents the sound traveling through top port 268 from passing between upper surface 104U of MEMS microphone electronic component 104 and lid plate 266 of lid 264. Accordingly, a front volume 377 is defined by acoustic seal 376 above diaphragm 110.

Substrate 102, lid adhesive 374, lid 264, acoustic seal 376 and diaphragm 110 define a back volume 378. Back volume 378 is a sealed cavity located behind (in back of) diaphragm 110. In accordance with this embodiment, back volume 378 includes three distinct regions in fluid communication with one another: (1) aperture 116 of MEMS microphone electronic component 104; (2) back volume expanding aperture 118; and (3) a lid cavity 380.

As discussed above, aperture 116 is the space within MEMS microphone electronic component 104 in back of diaphragm 110. Back volume expanding aperture 118 is located at lower surface 104L and aperture 116 of MEMS microphone electronic component 104. Accordingly, back volume expanding aperture 118 is in fluid communication with aperture 116 of MEMS microphone electronic component 104.

Lid cavity 380 is the remaining space within lid 264. More particularly, lid cavity 380 is defined by lid 264, lid adhesive 374, substrate 102, sides 104S of MEMS microphone electronic component 104 and acoustic seal 376. Back volume expanding aperture 118 couples aperture 116 of MEMS microphone electronic component 104 to lid cavity 380. In other words, back volume expanding aperture 118 provides acoustic access the back volume defined by the space (lid cavity 380) underneath lid 264. Lid cavity 380 is much larger than aperture 116.

Accordingly, by coupling lid cavity 380 to aperture 116 with back volume expanding aperture 118, the resulting back volume 378 is much larger than aperture 116 of MEMS microphone electronic component 104. More particularly, back volume 378 is essentially the size of the entire top port MEMS microphone package 100.

By maximizing back volume 378, the noise to signal ratio is minimized thus maximizing the sensitivity of top port MEMS package 100 as well as the range of applications.

Paying particular attention now to FIG. 3, substrate 102 further includes upper, e.g., first, traces 382 formed at upper surface 102U and lower, e.g., second, traces 384 formed at lower surface 102L. Lower traces 384 are electrically connected to upper traces 382 by electrically conductive vias 386 extending through substrate 102 between upper surface 102U and lower surface 102L.

Substrate 102 further includes an upper, e.g., first, solder mask 388 at upper surface 102U that protects first portions of upper traces 382 while exposing second portions, e.g., upper terminals 108, of upper traces 382. Substrate 102 further includes a lower, e.g., second, solder mask 390 at lower surface 102L that protects first portions of lower traces 384 while exposing second portions, e.g., lands 392, of lower traces 384. In one embodiment, lands 392 are distributed in an array thus forming a Land Grid Array (LGA).

Although a particular electrically conductive pathway is described above, other electrically conductive pathways can be formed. For example, contact metallizations can be formed between the various electrical conductors.

Further, instead of straight though vias 386, in one embodiment, substrate 102 is a multilayer substrate and a plurality of vias and/or internal traces form the electrical interconnection between upper traces 382 and lower traces 384.

In accordance with the embodiment illustrated in FIG. 3, back volume expanding aperture 118 is formed in a first metal layer 394 and in upper solder mask 388.

In accordance with this embodiment, substrate 102 includes a dielectric core 396. Dielectric core 396 is initially provided with first metal layer 394, e.g., a copper foil. First metal layer 394 is then selectively etched to form upper traces 382, i.e., upper traces 382 are portions of first metal layer 394. At the same time, first metal layer 394 is selectively etched to form an opening 398 therein in the shape of back volume expanding aperture 118.

Upper solder mask 388 is then formed. Upper solder mask 388 is patterned to expose upper terminals 108 as discussed above. At the same time, upper solder mask 388 is patterned to form an opening 399 therein in the shape of back volume expanding aperture 118. Opening 398 in first metal layer 394 and opening 399 in upper solder mask 388 and the exposed portion of dielectric core 396 exposed through openings 398, 399 collectively form back volume expanding aperture 118.

Illustratively, adhesive 354 is formed of epoxy having an approximate thickness of 25 µm, upper solder mask 388 has a thickness above first metal layer 394 of approximately 20 µm, and first metal layer 394, e.g., copper, has a thickness of approximately 20 µm. Accordingly, the distance between lower surface 104L of MEMS microphone electronic component 104 and back volume expanding aperture base 120 is approximately 65 µm, e.g., is 75 µm. Although particular dimensions are set forth, in light of this disclosure, those of skill in the art will understand that the dimensions are simply illustrative and that other dimensions exist in other embodiments.

As described above, portions of first metal layer 394 and upper solder mask 388 are selectively removed to form back volume expanding aperture 118. Such a selective removal process is sometimes called a subtractive back volume expanding aperture formation process. Generally, in a subtractive back volume expanding aperture formation process, a portion or portions of one or more structures of substrate 102 are selectively removed to form back volume expanding aperture 118.

Figure 4:
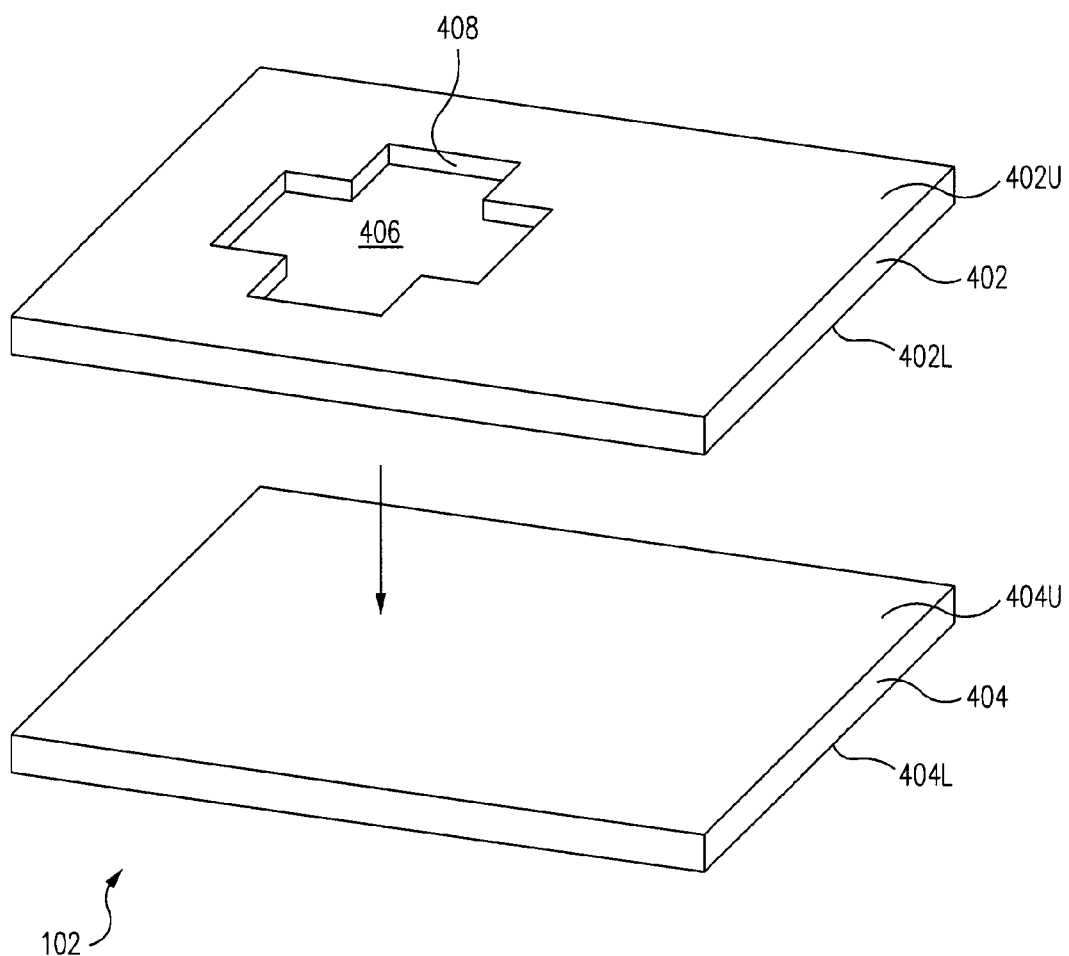
FIG. 4 is an exploded top perspective view of a substrate of the top port MEMS microphone package of FIG. 1 during fabrication in accordance with another embodiment.

FIG. 4 is an exploded top perspective view of substrate 102 of top port MEMS microphone package 100 of FIG. 1 during fabrication in accordance with another embodiment. Referring now to FIGS. 1 and 4 together, in accordance with this embodiment, substrate 102 includes a first dielectric layer 402 and a second dielectric layer 404. First dielectric layer 402 includes a lower, e.g., first, surface 402L and an upper, e.g., second, surface 402U. Second dielectric layer 404 includes an upper, e.g., first, surface 404U and a lower, e.g., second, surface 404L.

An opening 406 is formed in first dielectric layer 402 in the shape of back volume expanding aperture 118. Illustratively, opening 406 is formed by punching first dielectric layer 402. Opening 406 extends entirely through first dielectric layer 402 and between upper surface 402U and lower surface 402L. Opening 406 is defined by an opening sidewall 408 extending perpendicularly between upper surface 402U and lower surface 402L.

Lower surface 402L of first dielectric layer 402 is mounted to upper surface 404U of second dielectric layer 404, e.g., with adhesive, by lamination, or other mounting technique. After mounting, opening 406 and the exposed portion of upper surface 404U exposed through opening 406 collectively form back volume expanding aperture 118. More particularly, opening sidewall 408 (FIG. 4) forms back volume expanding aperture sidewall 122 (FIG. 1). The exposed portion of upper surface 404U exposed through opening 406 (FIG. 4) forms back volume expanding aperture base 120 (FIG. 1).

Figure 5:
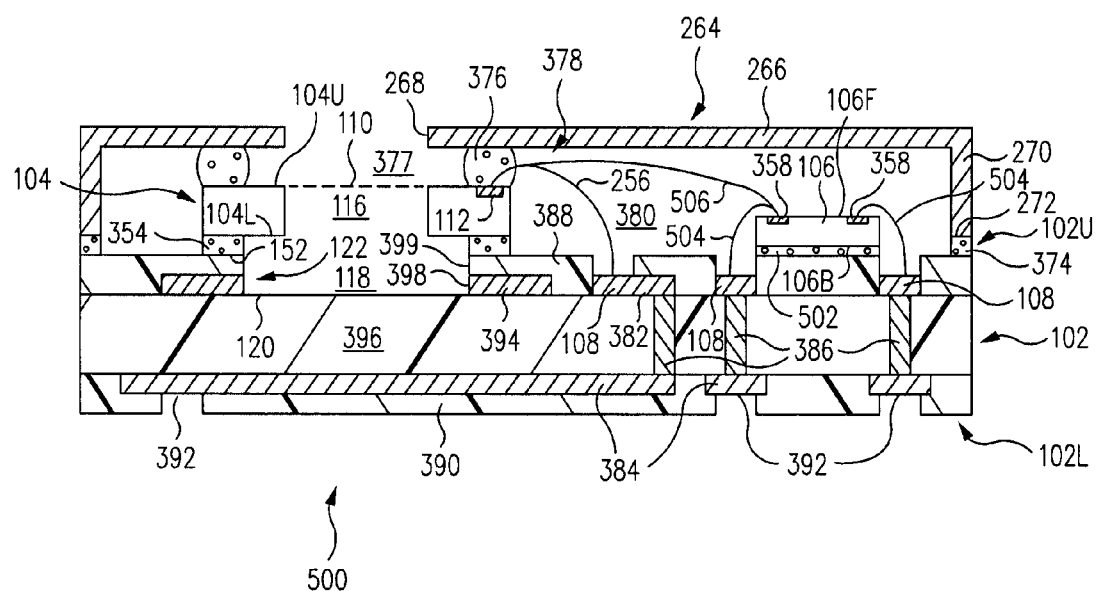
FIG. 5 is a cross-sectional view of a top port MEMS microphone package in accordance with another embodiment.

FIG. 5 is a cross-sectional view of a top port MEMS microphone package 500 in accordance with another embodiment. Top port MEMS microphone package 500 of FIG. 5 is similar to top port MEMS microphone package 100 of FIG. 3 and only the significant differences are discussed below.

Referring now to FIG. 5, in accordance with this embodiment, converter electronic component 106 is mounted in a wire bond configuration. More particularly, back side surface 106B is mounted to upper solder mask 388 by an adhesive 502. Bond pads 358 of converter electronic component 106 are electrically connected to respective terminals 108 with electrically conductive bond wires 504. Optionally, one or more of bond pads 112 of MEMS microphone electronic component 104 are electrically connected to respective one or more bond pads 358 of converter electronic component 106 with bond wires 506.

In accordance with another embodiment, a top port MEMS microphone package is formed without converter electronic component 106. Illustratively, the functionality of converter electronic component 106 is incorporated into MEMS microphone electronic component 104. Accordingly, a separate converter electronic component 106 is unnecessary and not provided.

Figure 6:
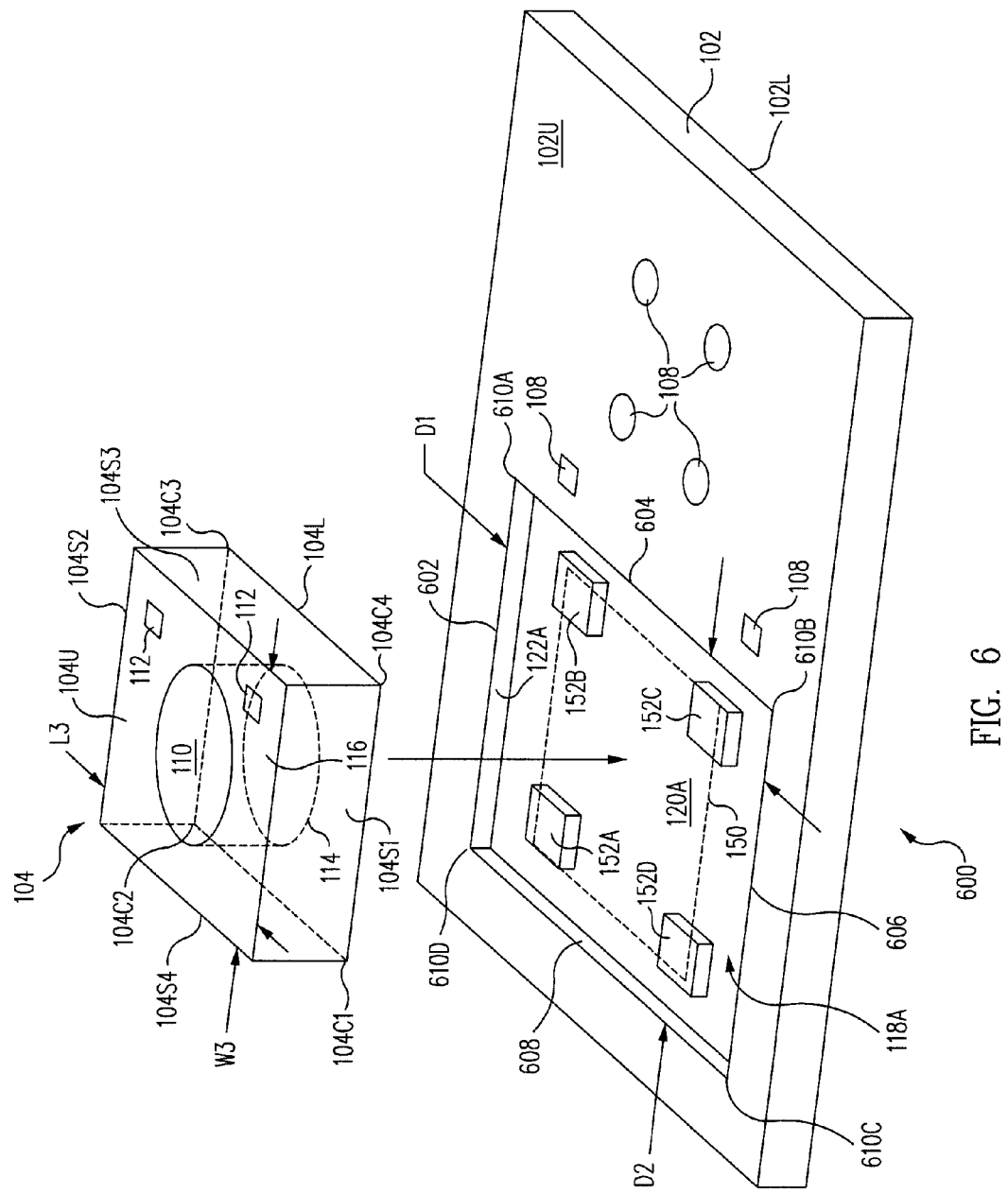
FIG. 6 is an exploded top perspective view of a top port MEMS microphone package during fabrication in accordance with another embodiment.
Figure 7:
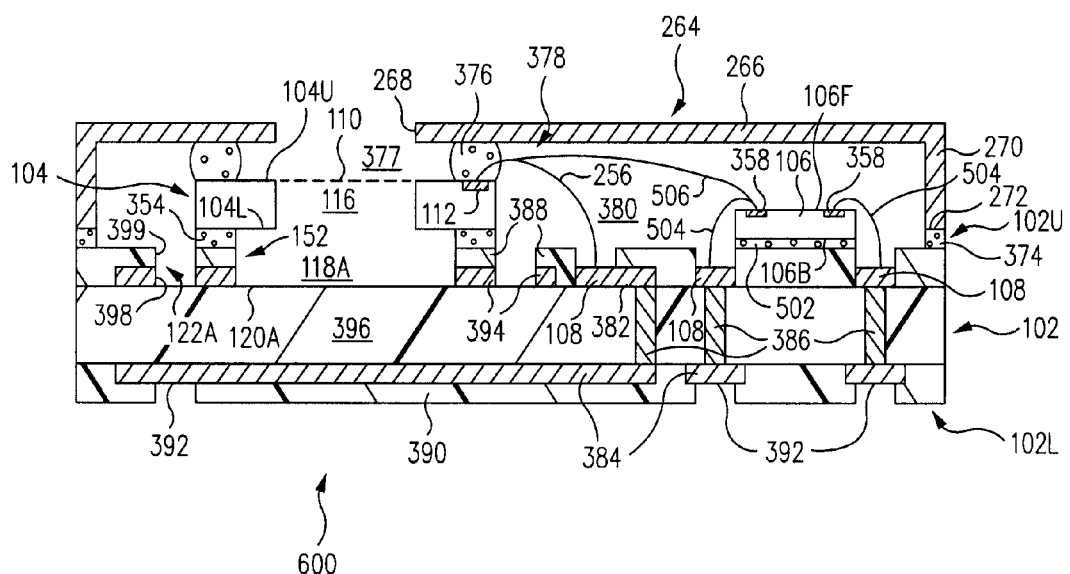
FIG. 7 is a cross-sectional view of the top port MEMS microphone package of FIG. 6 at a later stage during fabrication in accordance with one embodiment.

FIG. 6 is an exploded top perspective view of a top port MEMS microphone package 600 during fabrication in accordance with another embodiment. FIG. 7 is a cross-sectional view of top port MEMS microphone package 600 of FIG. 6 at a later stage during fabrication in accordance with one embodiment. Top port MEMS microphone package 600 of FIGS. 6, 7 is similar to top port MEMS microphone package 500 of FIG. 5 and only the significant differences are discussed below.

Referring now to FIGS. 6 and 7 together, in accordance with this embodiment, a back volume expanding aperture 118A is rectangular, e.g., square. Back volume expanding aperture 118A is defined by a back volume expanding aperture base 120A and a back volume expanding aperture sidewall 122A.

Back volume expanding aperture base 120A is a surface parallel to upper surface 102U of substrate 102 and located between upper surface 102U and lower surface 102L of substrate 102. Back volume expanding aperture sidewall 122A extends perpendicularly between back volume expanding aperture base 120A and upper surface 102U of substrate 102.

In accordance with this embodiment, back volume expanding aperture 118A is rectangular in the plane of upper surface 102U. More particularly, back volume expanding aperture 118A includes a first side 602, a second side 604, a third side 606, and a fourth side 608.

Sides 602, 606 are parallel to one another and extend in a direction parallel to upper surface 102U of substrate 102. Sides 602, 606 are separated by a distance D1. Sides 604, 608 are parallel to one another and extend in a direction parallel to upper surface 102U of substrate 102. Sides 604, 608 are separated by a distance D2. In one embodiment, distance D1 is equal to distance D2 although in other embodiments, distance D1 is greater than or less than distance D2.

Sides 602, 606 are perpendicular to sides 604, 608. The intersection of side 602 and side 604 defines a first corner 610A of back volume expanding aperture 118A. The intersection of side 604 and side 606 defines a second corner 610B of back volume expanding aperture 118A. The intersection of side 606 and side 608 defines a third corner 610C of back volume expanding aperture 118A. The intersection of side 608 and side 602 defines a fourth corner 610D of back volume expanding aperture 118A.

Distance D1 is greater than length L3 of MEMS microphone electronic component 104. Further, distance D2 is greater than width W3 of MEMS microphone electronic component 104. Accordingly, back volume expanding aperture 118A projects laterally outward past sides 104S1, 104S2, 104S3, 104S4 of electronic component 104. More particularly, sides 606, 602, 604, 608 are located laterally outwards past sides 104S1, 104S2, 104S3, 104S4, respectively.

In accordance with this embodiment, MEMS microphone electronic component mounting pads 152A, 152B, 152C, 152D are located within back volume expanding aperture 118A. As illustrated, the four corners 104C1, 104C2, 104C3, 104C4 of MEMS microphone electronic component 104 including lower surface 104L are mounted to and support by MEMS microphone electronic component mounting pads 152D, 152A, 152B, 152C, respectively, by adhesive 354. Generally, MEMS microphone electronic component mounting pads 152A, 152B, 152C, 152D, sometimes called islands, support MEMS microphone electronic component 104 above back volume expanding aperture 118A.

In accordance with this embodiment and in a manner similar to that discussed above, back volume 378 includes three distinct regions in fluid communication with one another: (1) aperture 116 of MEMS microphone electronic component 104; (2) back volume expanding aperture 118A; and (3) lid cavity 380.

In accordance with one embodiment, back volume expanding aperture 118A is formed using a subtractive process where portions of first metal layer 394 and upper solder mask 388 are selectively removed. Accordingly, MEMS microphone electronic component mounting pads 152A, 152B, 152C, 152D are formed of remaining portions of first metal layer 394 and upper solder mask 388.

In another embodiment such as that set forth below in reference to FIGS. 8 and 9, an additive process is used to create MEMS microphone electronic component mounting pads that protrude above upper surface 102U of substrate 102.

Figure 8:
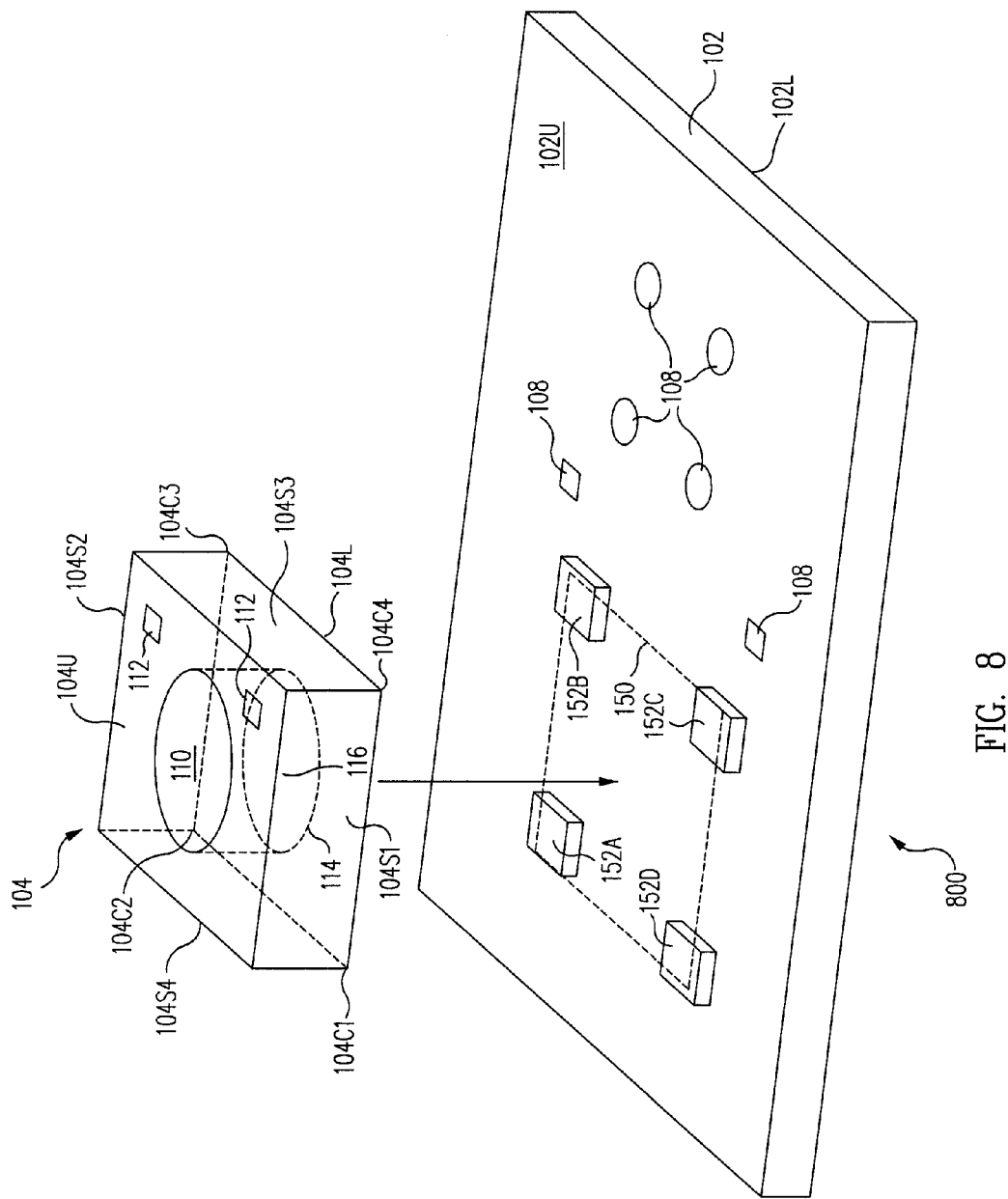
FIG. 8 is an exploded top perspective view of a top port MEMS microphone package during fabrication in accordance with yet another embodiment.

FIG. 8 is an exploded top perspective view of a top port MEMS microphone package 800 during fabrication in accordance with yet another embodiment. FIG. 9 is a cross-sectional view of top port MEMS microphone package 800 of FIG. 8 at a later stage during fabrication in accordance with one embodiment. Top port MEMS microphone package 800 of FIGS. 8, 9 is similar to top port MEMS microphone package 500 of FIG. 5 and only the significant differences are discussed below.

Figure 9:
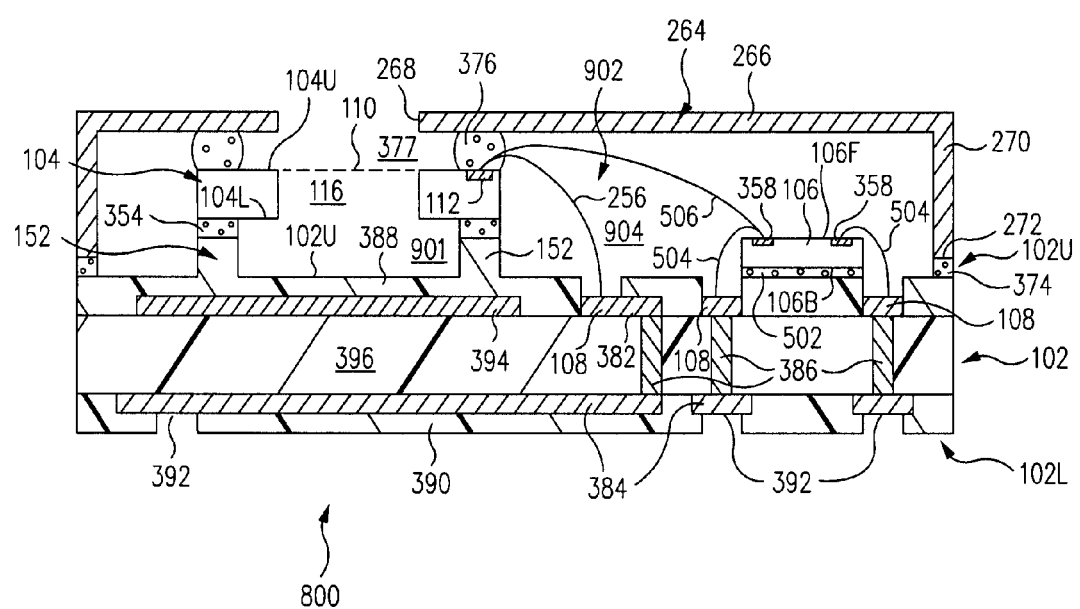
FIG. 9 is a cross-sectional view of the top port MEMS microphone package of FIG. 8 at a later stage during fabrication in accordance with one embodiment.

Referring now to FIGS. 8 and 9 together, in accordance with this embodiment, MEMS microphone electronic component mounting pads 152A, 152B, 152C, 152D are protrusions that project above upper surface 102U of substrate 102. As illustrated, the four corners 104C1, 104C2, 104C3, 104C4 of MEMS microphone electronic component 104 including lower surface 104L are mounted to and support by MEMS microphone electronic component mounting pads 152D, 152A, 152B, 152C, respectively by adhesive 354. Generally, MEMS microphone electronic component mounting pads 152A, 152B, 152C, 152D, sometimes called pedestals, support MEMS microphone electronic component 104 above upper surface 102U. More particularly, a space 901 exists between lower surface 104L of MEMS microphone electronic component 104 and upper surface 102U of substrate 102.

In accordance with this embodiment, a back volume 902 includes two distinct regions in fluid communication with one another: (1) aperture 116 of MEMS microphone electronic component 104; and (2) a lid cavity 904.

As discussed above, aperture 116 is the space within MEMS microphone electronic component 104 in back of diaphragm 110. Lid cavity 904 is the remaining space within lid 264. More particularly, lid cavity 904 is defined by lid 264, lid adhesive 374, substrate 102, sides 104S, and lower surface 104L of MEMS microphone electronic component 104 and acoustic seal 376. Lid cavity 904 extends underneath MEMS microphone electronic component 104 and includes space 901 between lower surface 104L of MEMS microphone electronic component 104 and upper surface 102U of substrate 102. Accordingly, lid cavity 904 is in fluid communication with aperture 116 of MEMS microphone electronic component 104.

Lid cavity 904 is much larger than aperture 116. More particularly, back volume 902 is essentially the size of the entire top port MEMS microphone package 800. By maximizing back volume 902, the noise to signal ratio is minimized thus maximizing the sensitivity of top port MEMS package 800 as well as the range of applications.

In accordance with one embodiment, MEMS microphone electronic component mounting pads 152A, 152B, 152C, 152D are formed using an additive process where portions of upper solder mask 388 are selectively built up to be thicker. More particularly, during formation of upper solder mask 388, upper solder mask 388 is formed to be thicker at regions corresponding to MEMS microphone electronic component mounting pads 152A, 152B, 152C, 152D to form MEMS microphone electronic component mounting pads 152A, 152B, 152C, 152D. However, in light of this disclosure, those of skill in the art will understand that MEMS microphone electronic component mounting pads 152A, 152B, 152C, 152D are formed by mounting additional structures to upper solder mask 388, instead of being formed from thicker regions of upper solder mask 388, in accordance with other embodiments.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An electronic component package comprising:
   a substrate comprising a back volume expanding aperture therein;
   a Micro Electro Mechanical Systems (MEMS) microphone electronic component with a first surface comprising an aperture and a second surface comprising a diaphragm, said first surface coupled to the substrate above a portion of the back volume expanding aperture; and a lid comprising a lid cavity, an inner surface of the lid coupled to the second surface of the MEMS microphone electronic component, the back volume expanding aperture directly connecting the aperture of the MEMS microphone electronic component to the lid cavity such that the aperture of the MEMS microphone electronic component is in fluid communication with the lid cavity.

2. The electronic component package of claim 1 wherein a first surface of the diaphragm of the MEMS microphone is in fluid communication with the aperture of the MEMS microphone electronic component, and the lid comprises a top port in fluid communication with a second surface of the diaphragm opposite the first surface of the diaphragm.

3. The electronic component package of claim 2 wherein the diaphragm is exposed directly to the ambient environment through the top port.

4. The electronic component package of claim 2 further comprising an acoustic seal forming a seal between a surface of the MEMS microphone electronic component and the inner surface of the lid, such that no air may flow between the top port and the lid cavity.

5. The electronic component package of claim 4 wherein the back volume expanding aperture comprises a volume within the substrate with its bottom surface comprising a plane parallel to a surface on which the MEMS microphone electronic component is coupled.

6. The electronic component package of claim 4 wherein the substrate further comprises terminals and the MEMS microphone electronic component further comprises bond pads at the surface, the electronic component package further comprising bond wires directly coupling the bond pads to the terminals.

7. The electronic component package of claim 6 wherein the acoustic seal encloses the bond pads and a portion of the bond wires.

8. The electronic component package of claim 4 wherein the acoustic seal prevents sound traveling through the top port from passing between the surface of the MEMS microphone electronic component and the inner surface of the lid.

9. The electronic component package of claim 1 wherein a first portion of the back volume expanding aperture is located directly below the aperture of the MEMS microphone electronic component and a second portion of the back volume expanding aperture extends laterally beyond the MEMS microphone electronic component.

10. The electronic component package of claim 1 further comprising a plurality of MEMS microphone electronic component mounting pads coupling the MEMS microphone electronic component to the substrate above the back volume expanding aperture of the substrate, wherein adjacent ones of the plurality of MEMS microphone electronic component mounting pads are separated from each other by an air gap.

11. The electronic component package of claim 10 wherein each of a plurality of corners of the MEMS microphone electronic component is coupled to a respective one the MEMS microphone electronic component mounting pads.

12. The electronic component package of claim 10 wherein each of the MEMS microphone electronic component mounting pads comprises a respective portion of a metal layer and a respective portion of a solder mask formed on the respective portion of the metal layer.

13. The electronic component package of claim 10 wherein the MEMS microphone electronic component mounting pads comprise areas of a first surface of the substrate outside of the back volume expanding aperture.

14. The electronic component package of claim 10 wherein the MEMS microphone electronic component mounting pads are formed within the back volume expanding aperture.

15. An electronic component package comprising:
a substrate;
a Micro Electro Mechanical Systems (MEMS) microphone electronic component comprising a first surface comprising an aperture and an opposite second surface comprising a diaphragm;
a lid defining a lid cavity, an inner surface of the lid coupled to the second surface of the MEMS microphone electronic component;
MEMS microphone electronic component mounting pads coupling the first surface of the MEMS microphone electronic component to a first surface of the substrate such that a space exists between the first surface of the MEMS microphone electronic component and the first surface of the substrate; and
an adhesive directly attaching the first surface of the MEMS microphone electronic component to the MEMS microphone electronic component mounting pads.

16. The electronic component package of claim 15 wherein the MEMS microphone electronic component mounting pads are protrusions that project above the first surface of the substrate.

17. The electronic component package of claim 15 further comprising an acoustic seal forming a seal between a surface of the MEMS microphone electronic component and the inner surface of the lid.

18. A method of forming an electronic component package comprising:
mounting a first surface of a Micro Electro Mechanical Systems (MEMS) microphone electronic component to a substrate with MEMS microphone electronic component mounting pads, wherein the mounting comprises directly attaching the MEMS microphone electronic component to the MEMS microphone electronic component mounting pads with an adhesive;
applying an acoustic seal to a second surface of the MEMS microphone electronic component around a diaphragm of the MEMS microphone electronic component; and
mounting a lid to the substrate and to the second surface of the MEMS microphone electronic component such that the acoustic seal forms a seal around a top port of the lid and the diaphragm.

19. The method of claim 18 further comprising forming a back volume expanding aperture in the substrate by selectively removing portions of the substrate.

20. The method of claim 18 further comprising forming a back volume expanding aperture in the substrate by punching an opening in a first dielectric layer and mounting the first dielectric layer to a second dielectric layer.

* * * * *